US006849908B2

(12) United States Patent
Hirano et al.

(10) Patent No.: US 6,849,908 B2
(45) Date of Patent: Feb. 1, 2005

(54) SEMICONDUCTOR DEVICE AND METHOD OF MANUFACTURING THE SAME

(75) Inventors: Izumi Hirano, Kanagawa-Ken (JP); Masato Koyama, Kanagawa-Ken (JP); Akira Nishiyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/772,373

(22) Filed: Feb. 6, 2004

(65) Prior Publication Data

US 2004/0164329 A1 Aug. 26, 2004

(30) Foreign Application Priority Data

Feb. 26, 2003 (JP) ........................................ 2003-048515

(51) Int. Cl.[7] ........................ H01L 29/76; H01L 29/94; H01L 31/062; H01L 31/113; H01L 31/119
(52) U.S. Cl. ....................... 257/410; 257/411; 438/216; 438/261; 438/140; 438/454
(58) Field of Search ................................ 257/410–411; 438/216, 261, 140, 454

(56) References Cited

U.S. PATENT DOCUMENTS 6,020,243 A    2/2000  Wallace et al.

Primary Examiner—Fetsum Abraham
(74) Attorney, Agent, or Firm—Oblon, Spivak, McClelland, Maier & Neustadt, P.C.

(57) ABSTRACT

A good interface characteristic can be maintained, and a leakage current of a dielectric film can be decreased. A semiconductor device according to one aspect of the present invention includes: a semiconductor substrate; a gate dielectric film containing at least nitrogen and a metal, the gate dielectric film being formed on the semiconductor substrate, and including a first layer region contacting the semiconductor substrate, a second layer region located at a side opposite to that of the first layer region in the gate dielectric film, and a third layer region located between the first and second layer regions, a maximum value of a nitrogen concentration in the third layer region being higher than maximum values thereof in the first and second layer regions; a gate electrode contacting the second layer region; and a pair of source and drain regions formed at both sides of the gate dielectric film in the semiconductor substrate.

18 Claims, 10 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2003-48515, filed on Feb. 26, 2003 in Japan, the entire contents of which are incorporated herein by reference.

BACKGROUND OF THE INVENTION

1. Field of the Invention

The present invention relates to a semiconductor device having a MIS (Metal-Insulator-Semiconductor) structure, to which an electric field is applied, such as a field effect transistor, and a method of manufacturing such a semiconductor device.

2. Related Art

In order to meet the requirements of a speed-up and a higher integration of LSIs, the miniaturization of transistors is being further advanced. As this trend is accelerating, a thinner gate dielectric film is continuously being sought after. In a conventional field effect transistor having a MIS structure (MISFET=Metal-Insulator-Semiconductor Field Effect Transistor), $SiO_2$ is used as a material of a gate dielectric film. However, when the thickness of the $SiO_2$ layer is decreased to be as thin as 1 nm, a problem arises in that there is an increase in a leakage current flowing from a gate metal to a substrate via the $SiO_2$ layer. In particular, this problem is serious in a MISFET with a low standby power.

In order to solve this problem, the introduction of a high-k gate dielectric film as a substitute for the $SiO_2$ gate dielectric film is being considered. The advantageous effect of the use of a material having a higher dielectric constant than $SiO_2$ for forming a gate dielectric film is that gate capacitance at a certain level can be secured without decreasing the effective film thickness (actual film thickness or physical film thickness) of the gate dielectric film. As a result, it is possible to suppress the leakage current flowing through the gate dielectric film. However, there is a problem in that a high-k dielectric material tends to generate an interface state, a fixed charge, etc., because generally a high-k dielectric material does not have a good interface characteristic at an interface with a silicon substrate.

Furthermore, a so-called metal silicate, which is a metal-added $SiO_2$, is also being considered to be a material for gate dielectric film. Since a metal silicate contains silicon, the relative dielectric constant thereof is lower, i.e., 8-20. However, a metal silicate is superior in interface characteristic at an interface with a silicon wafer, resulting in that a decrease in drive current capability caused by interface defects, which is easy to occur in the case of a general high-k material, is unlikely to occur.

More strictly speaking, the interface characteristic at an interface between a silicon substrate and a metal silicate layer is far behind that at an interface between a silicon substrate and a $SiO_2$ layer. For example, when a metal silicate is used to form a gate dielectric film of an FET, there is a problem in that electrons flowing through a channel region at a surface of the silicon substrate suffer the influence of remote scattering caused by a potential field generated by the metal contained in the metal silicate. Furthermore, nitrogen added to the metal silicate is also considered to be a cause of the degradation of the interface characteristic.

In order to solve this problem, a so-called "graded composition metal silicate" structure has been proposed to improve the interface characteristic of a dielectric film, as disclosed in Japanese Patent Laid-Open Publication No. 2000-49349. In this structure, the compositions of metal and nitrogen within a metal silicate are lower near the silicon substrate, but become higher as distance increases from the silicon substrate.

Furthermore, a structure is proposed, in which a metal composition is higher at the center of a gate dielectric film and lower near a gate electrode and near the interface with a silicon substrate, as disclosed in Japanese Patent Application No. 2002-49464.

As described above, a structure of gate dielectric film using a metal silicate is proposed, in which metal and nitrogen compositions are graded in order to maintain the interface characteristic at the interface with silicon to be good. However, since the metal or nitrogen concentration at the gate electrode side is higher in the aforementioned structures, the band offset of the dielectric film decreases, which may result in an increase in leakage current.

SUMMARY OF THE INVENTION

A semiconductor device according to a first aspect of the present invention includes: a semiconductor substrate; a gate dielectric film containing at least nitrogen and a metal, the gate dielectric film being formed on the semiconductor substrate, and including a first layer region contacting the semiconductor substrate, a second layer region located at a side opposite to that of the first layer region in the gate dielectric film, and a third layer region located between the first and second layer regions, a maximum value of a nitrogen concentration in the third layer region being higher than maximum values thereof in the first and second layer regions; a gate electrode contacting the second layer region; and a pair of source and drain regions formed at both sides of the gate dielectric film in the semiconductor substrate.

A second aspect of the present invention proposes a method of manufacturing a semiconductor device including a metal silicate layer formed on a semiconductor substrate, the metal silicate layer containing at least nitrogen and including a first layer region located at a side of the semiconductor substrate, a second layer region located at a side opposite to that of the first layer region, and a third layer region located between the first and second layer regions, the method including: depositing a metal silicate layer having a uniform metal concentration throughout the first, second, and third layer regions; and performing a heat treatment on the metal silicate layer so that a nitrogen concentration in the metal silicate layer becomes higher in the third layer region than in the first and second layer regions.

A third aspect of the present invention proposes a method of manufacturing a semiconductor device including a metal oxide layer formed on a semiconductor substrate, the metal oxide layer containing at least nitrogen and including a first layer region located at a side of the semiconductor substrate, a second layer region located at a side opposite to that of the first layer region, and a third layer region located between the first and second layer regions, the method including: depositing a metal oxide layer having a uniform metal concentration throughout the first, second, and third layer regions; and performing a heat treatment on the metal oxide layer so that a nitrogen concentration in the metal oxide layer becomes higher in the third layer region than in the first and second layer regions.

DESCRIPTION OF THE EMBODIMENTS

Figure 1A:
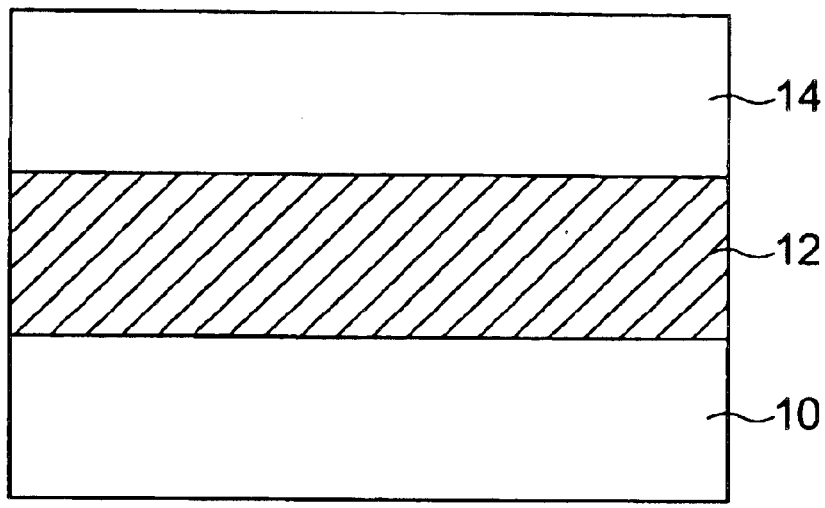
FIGS. 1A and 1B are schematic sectional views for explaining a method of manufacturing a semiconductor device according to the first embodiment of the present invention.

Hereinafter, embodiments and examples of the present invention will be described in detail with reference to the accompanying drawings. In the following descriptions, the same reference numerals are assigned for the same elements, and overlapping descriptions therefor are avoided. Since the drawings are schematically shown, the shapes, dimensions, ratios, etc. of the illustrated elements are likely to be different from those of the actual elements. However, when an actual device is intended to be manufactured, the following descriptions and the prior art can be considered.
(First Embodiment)

Figure 1B:
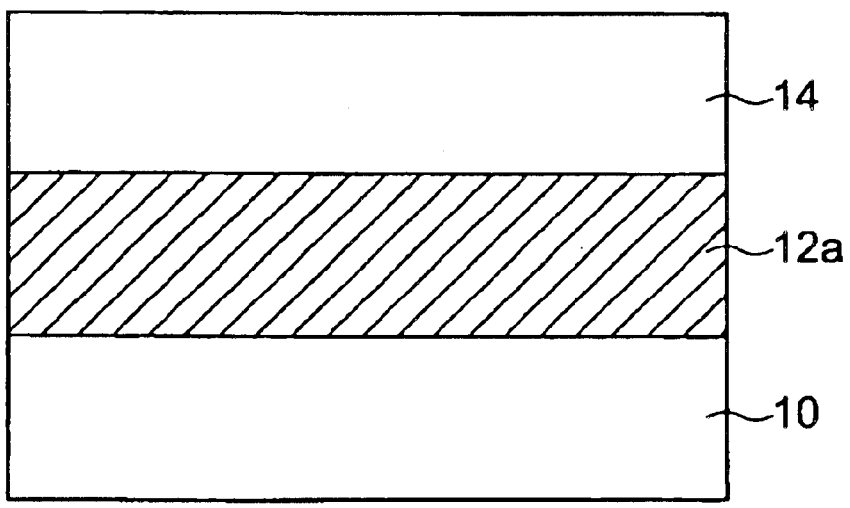

FIGS. 1A and 1B are sectional views for explaining a method of manufacturing a MISFET according to a first embodiment of the present invention, and a semiconductor device obtained thereby.

First, as shown in FIG. 1A, a zirconium silicate layer 12, to which nitrogen is doped, is formed on a semiconductor substrate, e.g., a silicon substrate 10, followed by a cap layer 14. The nitrogen-doped zirconium silicate layer 12 is formed of a nitrogen-doped zirconium-silicon compound, and has substantially uniform composition distributions of zirconium and silicon in a depth direction of the layer. The depth direction of the zirconium silicate layer 12 herein means a direction extending from the interface with the cap layer 14 to the interface with the silicon substrate 10.

The cap layer 14 is formed of, e.g., a conductive material such as an impurity-doped polycrystalline silicon.

Figure 2A:
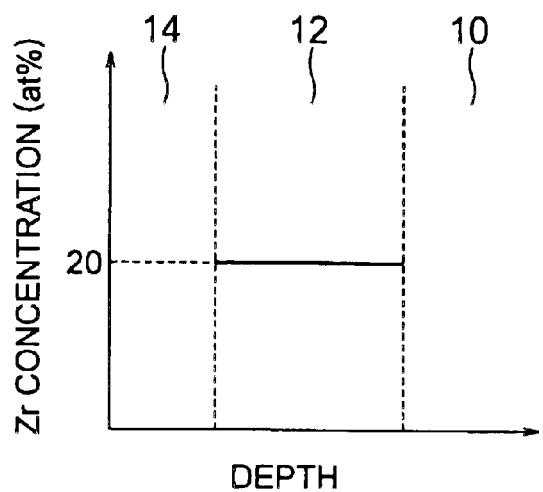
FIGS. 2A to 2C show concentration distributions before heat treatment, for explaining the method of manufacturing a semiconductor device according to the first embodiment of the present invention.
Figure 2B:
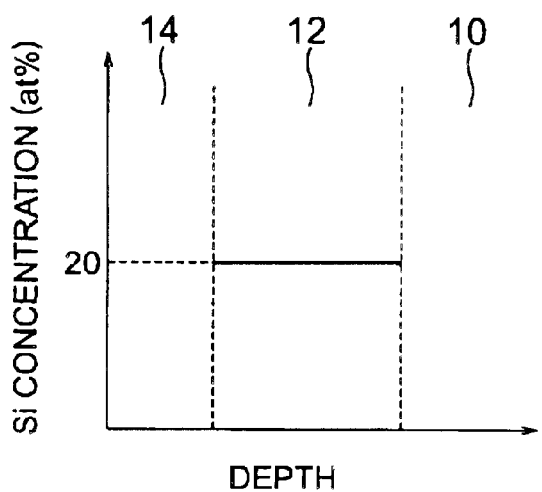
Figure 2C:
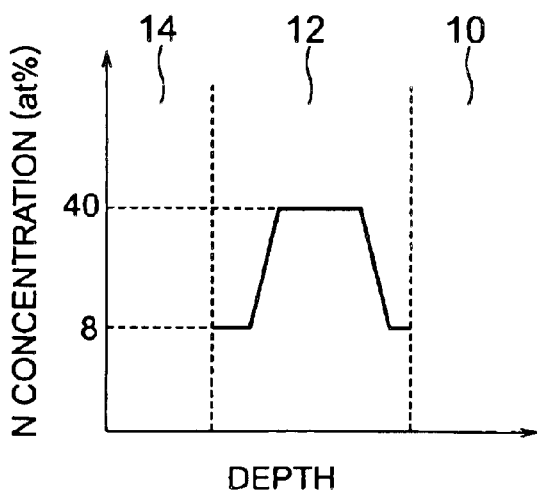

The composition distributions of the elements in the zirconium silicate layer 12 at this stage will be described below with reference to FIGS. 2A, 2B, and 2C. FIG. 2A shows a concentration distribution of zirconium; FIG. 2B shows a concentration distribution of silicon; and FIG. 2C shows a concentration distribution of nitrogen. The concentrations in the depth direction of zirconium and silicon are adjusted to be uniform. The atomic concentration of zirconium is set to be 20 at %, and that of silicon is set to be 20 at %. The concentration distribution of nitrogen is set to be lower at the cap layer 14 side and the silicon substrate 10 side, i.e., 8 at %, and higher at the central portion, i.e., 40 at %. A method of achieving such a composition distribution will be described in detail later. Herein, "a substantially uniform concentration of a metal (zirconium) in a depth direction of the layer" means that the variations in concentration are in the range of about 20% or less.

Thereafter, a heat treatment is performed on this laminated layer, e.g., in a nitrogen atmosphere at a temperature of about 1,000° C. for thirty seconds. As a result, diffusion of silicon and metal atoms occurs in a region of the layer where the nitrogen concentration is lower, and, as shown in FIG. 1B, the zirconium silicate layer 12 becomes a zirconium silicate layer 12a, the composition distribution of which is changed from that of the zirconium silicate layer 12.

Figure 3A:
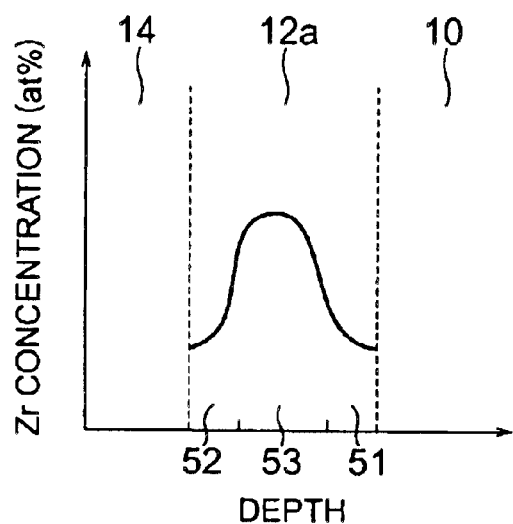
FIGS. 3A to 3C show concentration distributions after heat treatment, for explaining the method of manufacturing a semiconductor device according to the first embodiment of the present invention.
Figure 3B:
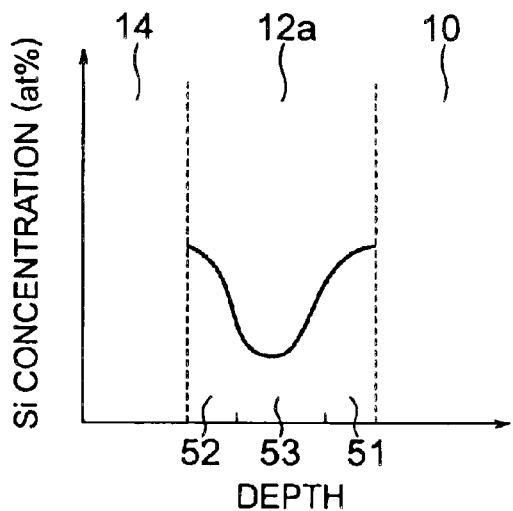
Figure 3C:
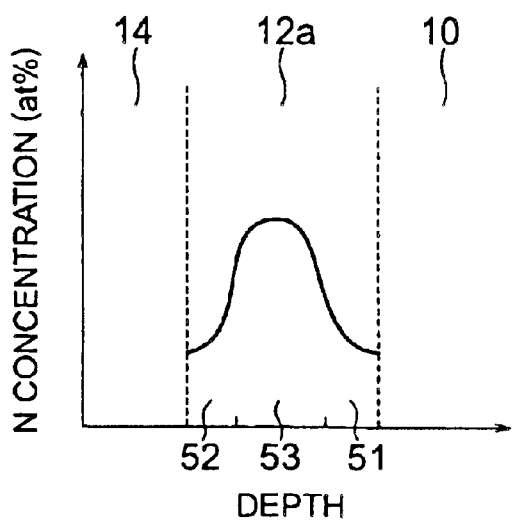

The composition distributions of the elements in the zirconium silicate layer 12a are as shown in FIGS. 3A, 3B, and 3C. Specifically, as shown in FIG. 3B, silicon atoms move to a first layer region 51 at the silicon substrate 10 side, and a second layer region 52 at the cap layer 14 side (segregation). As a result, the number of silicon atoms in a third layer region 53 sandwiched between the first layer region 51 and the second layer region 52 decreases, and maximum silicon concentration in the third layer region 53 is lower than maximum silicon concentrations in the first and second layer regions 51 and 52. The boundary between the first layer region 51 and the third layer region 53 corresponds to an interface where the nitrogen concentration distribution in the zirconium silicate layer 12a is a mean value of the maximum value and the minimum value ((maximum value+minimum value)/2) at the silicon substrate 10 side, and the boundary between the second layer region 52 and the third layer region 53 corresponds to an interface where the nitrogen concentration distribution in the zirconium silicate layer 12a is a mean value of the maximum value and the minimum value at the cap layer 14 side. That is to say, in the first and second layer regions 51 and 52, the nitrogen concentration is less than the mean value of the maximum value and the minimum value, and in the third layer region 53, the nitrogen concentration is equal to or more than the mean value.

As shown in FIG. 3A, zirconium atoms in the zirconium silicate layer 12a decrease in the first layer region 51 at the silicon substrate 10 side and the second layer region 52 at the cap layer 14 side, and move to the third layer region 53. As a result, a maximum value of the zirconium concentration in the third layer region 53 becomes higher than maximum values in the first and second layer regions 51 and 52.

As shown in FIG. 3C, some of the nitrogen atoms, having segregated to the third layer region 53, move to the first and second layer regions 51 and 52 due to the heat treatment. Accordingly, the distribution profile thereof becomes smooth as compared to that of FIG. 2C. A maximum value of the nitrogen concentration in the third layer region 53 is still higher than maximum values in the first and second layer regions 51 and 52.

That is to say, the zirconium silicate layer of this embodiment has the following nitrogen concentration distribution profile. In the first and second layer regions 51 and 52, which have become pseudo-$SiO_2$ regions due to the graded composition structure, the nitrogen concentration is relatively lower, while in the third layer region 53, which has a higher metal concentration, the nitrogen concentration is relatively higher.

With such concentration distributions, it is possible to improve the band gap and to suppress the leakage voltage in the first and second layer regions 51 and 52 as compared with the third layer region 53.

By adding nitrogen to the zirconium silicate layer 12, it is possible to suppress diffusion of metal atoms in the heat treatment process. In the nitrogen-added zirconium silicate layer 12, Si-N bonds are formed, thereby suppressing diffusion of metal (zirconium) atoms into the zirconium silicate layer. As a result, it can be expected that this will have the effect of suppressing phase separation and crystallization.

Furthermore, it is possible to expect the effect of suppression of impurity diffusion from the cap layer 14 to the silicon substrate 10 by adding nitrogen to the zirconium silicate layer 12. That is to say, when polycrystalline silicon, to which an impurity such as boron is added, is used to form the cap layer 14, it is possible to suppress the diffusion of boron etc. to the silicon substrate 12.

In addition, by adding nitrogen to the zirconium silicate layer 12, it is possible to improve the heat resisting property of the zirconium silicate layer 12a, which is ultimately formed, thereby preventing the crystallization thereof. Due to the suppression of crystallization, impurity "penetration" from the cap layer 14 to the silicon substrate 10 can further be suppressed.

The higher the zirconium concentration in the zirconium silicate layer 12a is, the more easily it becomes crystallized by heat treatment. Accordingly, it is possible to suppress crystallization of the zirconium silicate layer 12a by increasing the nitrogen concentration thereof at the regions having a higher zirconium concentration.

As described above, according to this embodiment, it is possible to easily form a metal silicate layer with a graded metal composition such as zirconium.

Furthermore, it is possible to achieve a gate dielectric film having a high quality required for a MIS structure of the "0.1 μm or less generation" with the impurity penetration with respect to the silicon substrate and the crystallization of metal oxides being prevented.

In this embodiment, zirconium is used as the metal of the metal silicate layer. However, in embodiments of the present invention, hafnium, titanium, tantalum, aluminum, or a rare-earth element such as yttrium, lanthanum, cerium, etc., can be used instead of zirconium. In particular, hafnium works well with silicon. Thus, by using zirconium, hafnium, titanium, tantalum, aluminum, or a rare-earth element such as yttrium, lanthanum, cerium, etc. as the metal of the metal silicate layer, it is possible to obtain a metal silicate dielectric film having a high dielectric constant, being superior in heat resistance property and physical or chemical stability, and absorbing less moisture.

Figure 4:
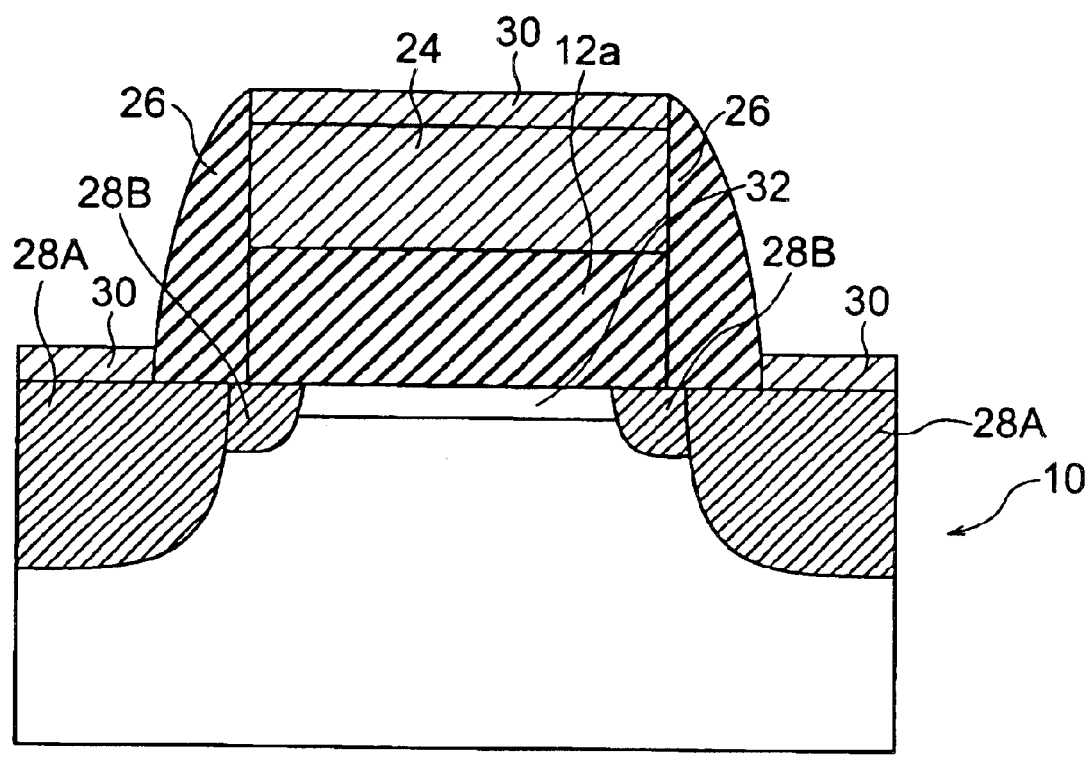
FIG. 4 is a schematic sectional view for explaining a MISFET according to the second embodiment of the present invention.

FIG. 4 is a sectional view in a gate length direction for explaining a MISFET.

A MIS structure obtained by laminating the aforementioned graded composition metal silicate layer 12a and the gate electrode 24 is formed on the main surface of the silicon substrate 10. Generally, the metal silicate layer 12a and the gate electrode 24 have a strip shape extending in a direction perpendicular to the paper of FIG. 4 (gate width direction).

The gate electrode 24 is formed of polycrystalline silicon. Sidewall insulating layers 26 are formed at both sides of the gate electrode 24. A pair of deep diffusion regions 28A, to which an impurity is diffused with a high concentration, and a pair of shallow diffusion regions 28B, each located between one of the deep diffusion regions 28A and the gate electrode 24, are formed in surface regions of the silicon substrate 10 located at the both sides of the gate electrode 24. Furthermore, a metal silicide layer 30 is formed on the deep diffusion regions 28A and the polycrystalline silicon of the gate electrode 24.

A channel region 32 is formed between the pair of shallow diffusion regions 28B by applying a voltage to the gate. The amount of impurity added to the channel region 32 is appropriately adjusted in order to adjust the threshold value of the transistor. Generally, element isolation regions (not shown in the drawings) for electrically isolate adjacent devices are formed between the MISFET.

In the MISFET of this embodiment, the metal silicate layer 12a with the graded composition serves as a gate dielectric film, thereby obtaining a high dielectric constant and high reliability. Accordingly, it is possible to suppress leakage current and tunneling current flowing between the gate electrode 24 and the silicon substrate 10.

(Second Embodiment)

Figure 5A:
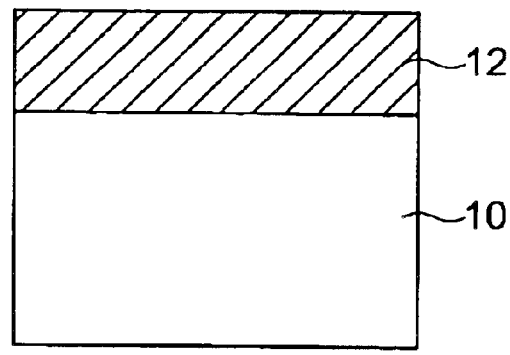
FIGS. 5A to 5C are schematic sectional views for explaining a method of manufacturing the MISFET according to the second embodiment of the present invention.
Figure 5B:
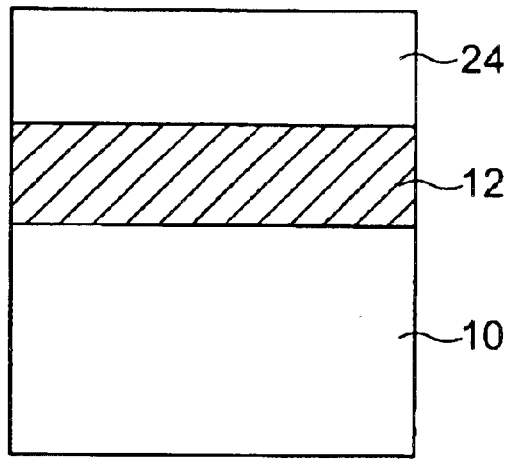
Figure 5C:
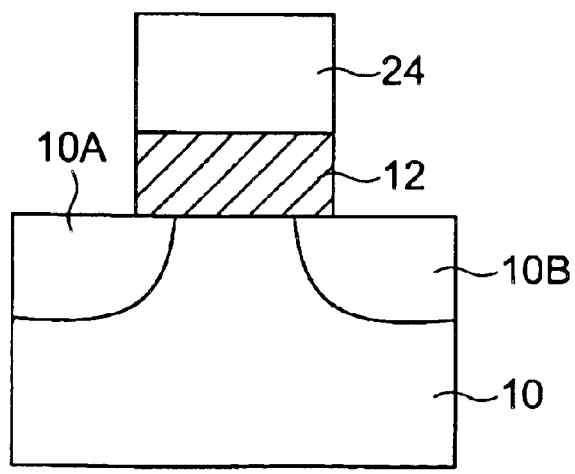

A method of manufacturing a gate dielectric film of a MISFET according to a second embodiment of the present invention will be described below. FIGS. 5A to 5C are sectional views showing the steps of manufacturing the MISFET of the second embodiment.

First, a semiconductor substrate, e.g., a silicon substrate 10, is prepared, on which element isolation regions (not shown in the drawings) for electrically isolate adjacent devices are formed. Then, a native oxide layer on the surface of the silicon substrate 10 is removed with diluted hydrofluoric (HF) acid solution, and dangling bonds at the surface of the silicon substrate 10 are hydrogen-terminated. Then, a metal silicate layer 12 with a uniform composition is formed on the silicon substrate 10 (FIG. 5A). A zirconium silicate layer having a thickness of 2 nm is an example of such a metal silicate layer. In this case, a zirconium oxide target and a silicon oxide target are used, and sputtering is performed using mixed gas plasma containing argon, oxygen, and nitrogen.

In the metal silicate layer 12 formed at this time, the metal and silicon concentrations in the depth direction of the layer are uniform, but the nitrogen concentration is higher at the central portion in the depth direction, and lower around the interfaces with the silicon substrate 10 and the gate electrode 24.

Besides sputtering, the metal silicate layer 12 can be formed by CVD (Chemical Vapor Deposition), or vapor deposition.

Figure 6:
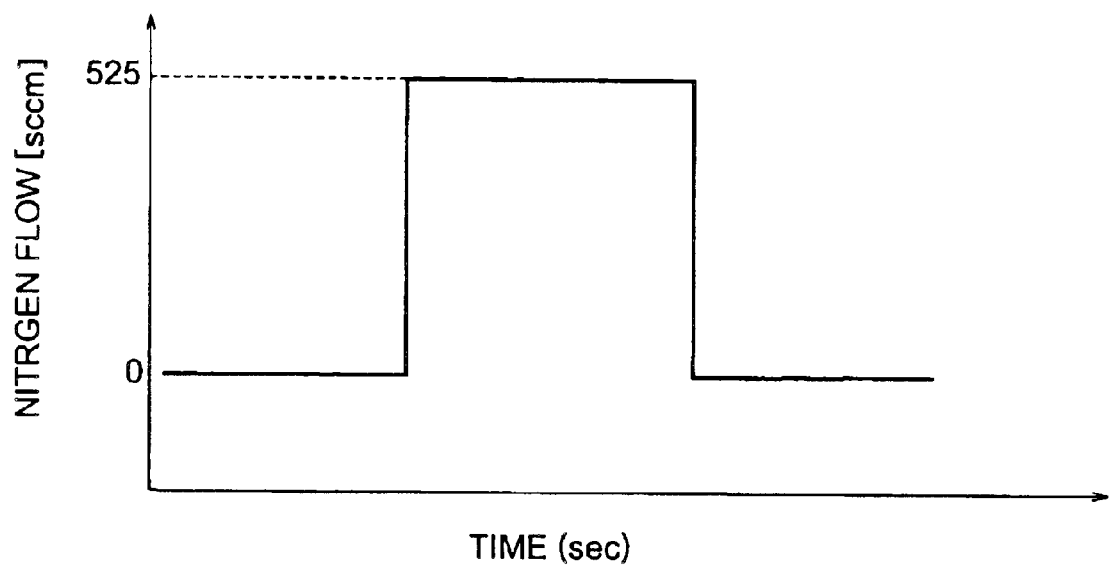
FIG. 6 schematically shows the amount of nitrogen ($N_2$) flowing during sputtering as it changes over time.

The nitrogen distribution as described above can be achieved by changing the amount of nitrogen gas $N_2$ flowing during the sputtering as time lapses. FIG. 6 schematically shows an example of the change in the amount of nitrogen gas $N_2$ during the sputtering over a period of time. The nitrogen concentration distribution as described above can also be achieved by first depositing a metal silicate layer that does not contain nitrogen, and then performing the plasma nitridation with the conditions (pressure, kind of plasma) being selected.

Then, as shown in FIG. 5B, a cap layer 24 of, e.g., polycrystalline silicon, is formed on the metal silicate layer 12. The cap layer 24 can be obtained by depositing an impurity (e.g., boron) doped polycrystalline silicon, or by first depositing polycrystalline silicon and then adding an impurity thereto.

Subsequently, as shown in FIG. 5C, the cap layer 24 and the metal silicate layer 12 are patterned using a photolithography technique, thereby forming the gate electrode 24 and the gate dielectric film 12. Thereafter, an impurity is doped into the silicon substrate 10 at both sides of the gate electrode 24, thereby forming impurity regions 10A and 10B to serve as a source and a drain. In order to activate the impurity, a heat treatment is performed on the impurity regions 10A and 10B, by which the metal silicate layer 12 changes into the metal silicate layer 12a described in the explanation of the first embodiment.

Thus, the metal silicate layer 12a having a graded composition, similar to that of the first embodiment, is achieved by performing a heat treatment on the silicon substrate 10 with the metal silicate layer 12 formed thereon.

There are other methods to achieve a graded composition metal silicate layer, e.g., a vapor deposition method and a sputtering method. For example, in the vapor deposition method, separate metal source and silicon source are used, and a metal/silicon ratio is changed during the formation of the layer. In the sputtering method, it is difficult to achieve a graded composition with a one-composition target. Accordingly, several targets each having a different composition are used, and a graded composition can be achieved by performing depositions a multiple of times.

These methods are somewhat complicated as compared to the above described method of the present invention, which is based on the phenomenon that metal and silicon atoms are difficult to move in a region of a layer having a higher nitrogen concentration, and are easy to move in a region having a lower nitrogen concentration.

In an example of this embodiment, a temperature of the cap layer (gate electrode) 24 formed of polycrystalline silicon was raised at a speed of 100° C./second. Then, a heat treatment was performed for a thirty seconds in a nitrogen atmosphere at 1,000° C., thereby forming the graded composition metal silicate layer 12.

The high-temperature annealing for achieving a graded composition can be performed after the formation of the cap layer 24 as shown in FIG. 5B instead of during the formation of the impurity regions 10A and 10B as shown in FIG. 5C.

(Third Embodiment)

Next, a semiconductor device according to a third embodiment of the present invention will be described with reference to FIGS. 7, 8A, 8B, and 8C. Generally, not only a metal silicate, but also a metal oxide without positively containing silicon can be used as a material of a dielectric film. In the third embodiment, a gate dielectric film formed of such a metal oxide will be described.

Figure 7:
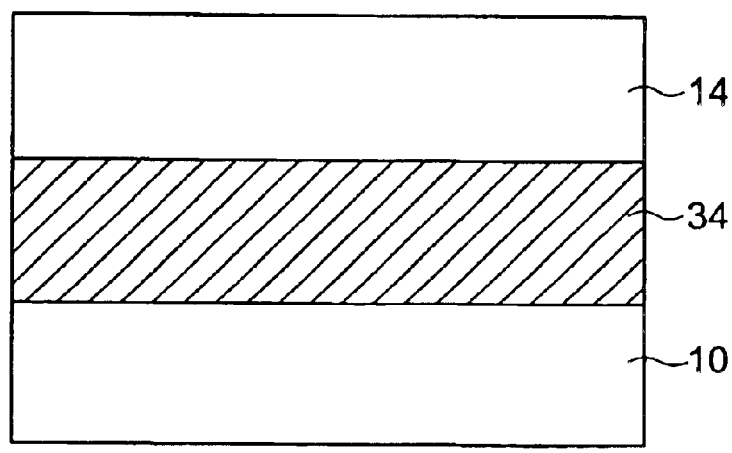
FIG. 7 is a schematic sectional view for explaining a MISFET according to the third embodiment of the present invention.
Figure 8A:
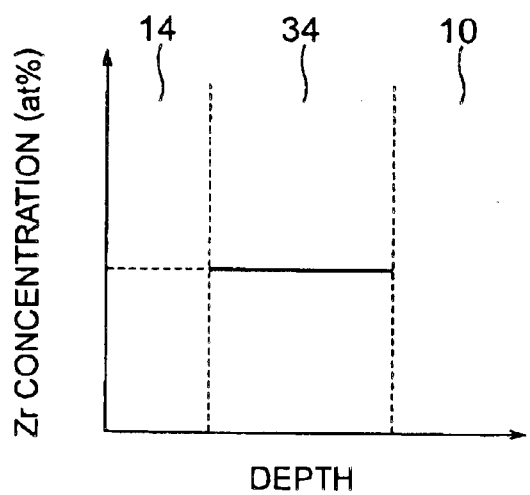
FIGS. 8A to 8C show concentration distributions of a metal, oxygen, and nitrogen in a metal oxide dielectric film in the semiconductor device according to the third embodiment of the present invention.
Figure 8B:
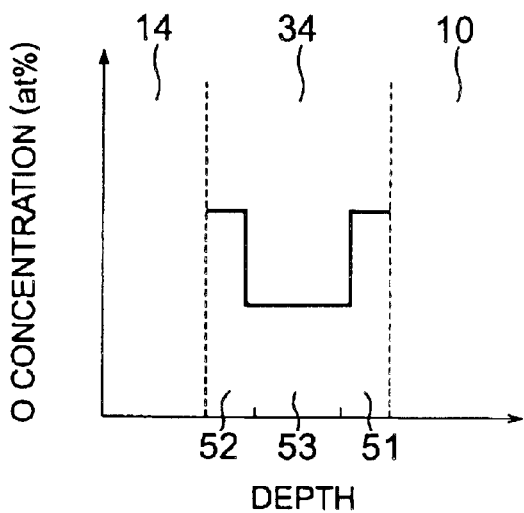
Figure 8C:
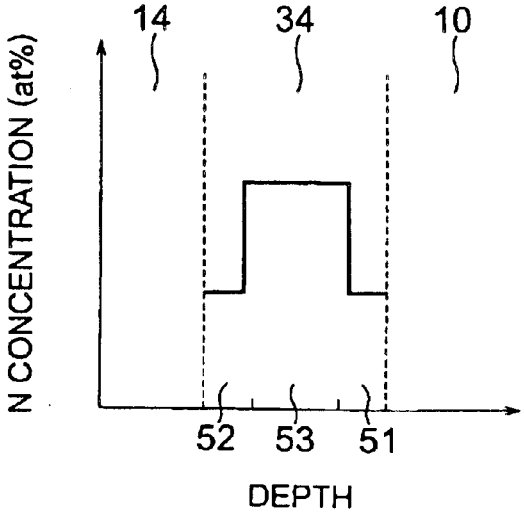

FIG. 7 is a sectional view of a laminated structure obtained by first forming a metal oxide layer 34 on a silicon substrate 10, and then forming a conductive cap layer 14 on the metal oxide layer 34. FIGS. 8A, 8B, and 8C schematically show concentration distributions of a metal (e.g., Zr), nitrogen (N), and oxygen (O) in the metal oxide layer 34.

As can be understood from FIG. 8A, the metal concentration in the depth direction in the metal oxide layer 34 is uniform. This means herein that the variations in concentrations are in the range of about 20 % or less.

As can be understood from FIG. 8B, in this embodiment, the oxygen concentration in the metal oxide layer 34 is relatively higher at the interface with the silicon substrate 10 (first layer region 51) and the interface with the conductive cap layer 14 (second layer region 52), and relatively lower at a region therebetween (third layer region 53).

As can be understood from FIG. 8C, in this embodiment, the nitrogen concentration in the metal oxide layer 34 is relatively lower in the first layer region 51 and the second layer region 52, and relatively higher in the third layer region 53 therebetween.

With such concentration distributions, like the metal silicate layer 12a in the first embodiment, the band gap can be improved for the first and second layer regions 51 and 52 as compared to the third layer region 53, thereby suppressing leakage current. The method of achieving such a nitrogen composition distribution can be achieved by changing the amount of nitrogen ($N_2$) gas depending on the deposition time, as shown in FIG. 6. Furthermore, the nitrogen composition distribution can be achieved by first depositing a metal oxide layer that does not contain nitrogen, and then performing plasma nitridation.

EXAMPLE

Next, a specific example of a method of manufacturing a device of the first embodiment will be described. FIGS. 9A to 11B show changes in composition distribution of zirconium and silicon in a depth direction of a nitrogen-doped zirconium silicate layer before and after heat treatment.

The horizontal axes of FIGS. 9A to 11B each represent a depth from the interface between the zirconium silicate layer 12, 12a and the cap layer 14 to the silicon substrate 10. The vertical axes each represent a concentration (at %) of Zr or Si. The thickness of the zirconium silicate layer 12 in this example is 95 Angstroms.

Figure 9A:
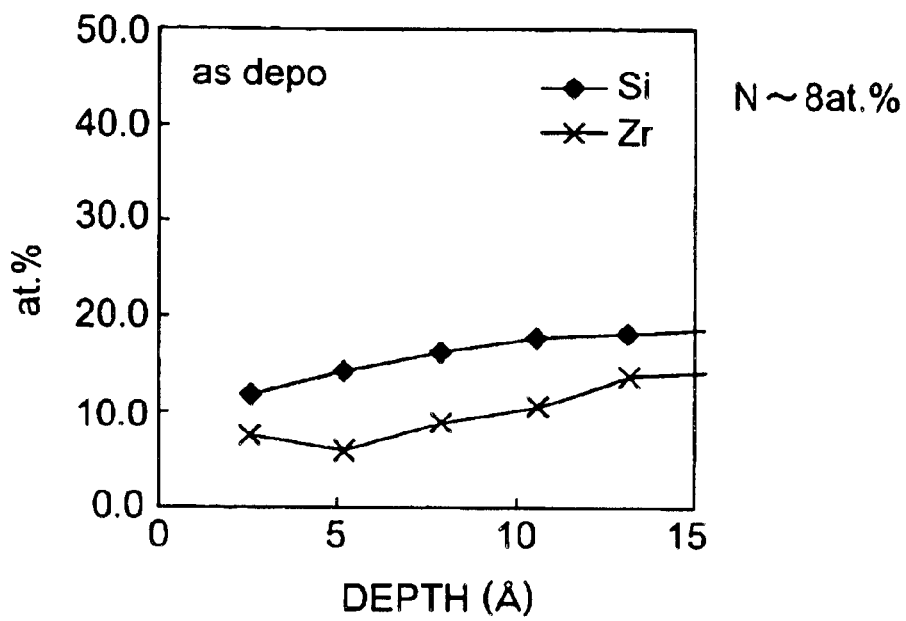
FIGS. 9A and 9B show measurement results of concentration distributions of a metal (zirconium) and silicon before and after heat treatment in a second layer region in the semiconductor device according to the first embodiment of the present invention.
Figure 9B:
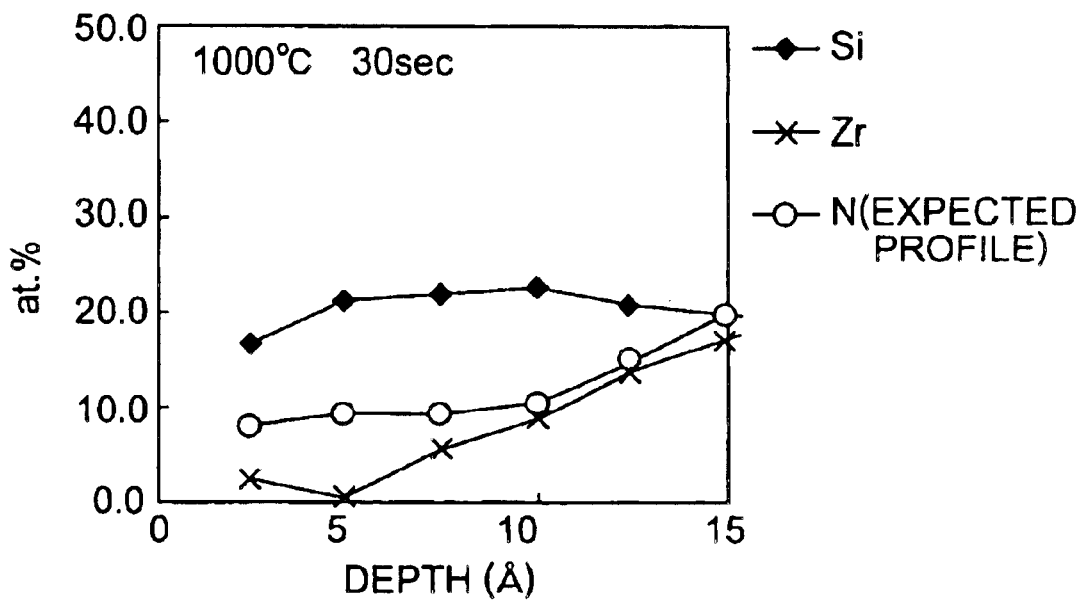
Figure 10A:
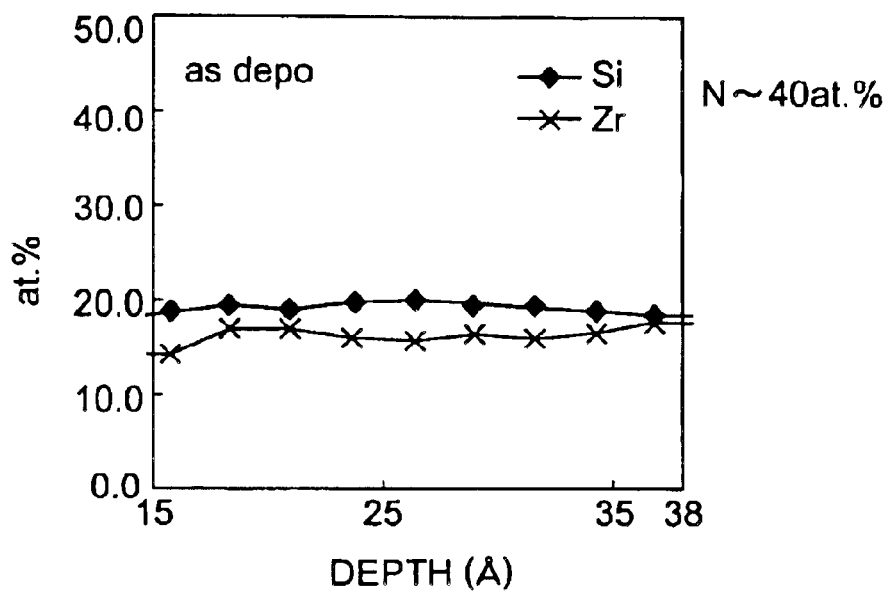
FIGS. 10A and 10B show measurement results of concentration distributions of a metal (zirconium) and silicon before and after heat treatment in a third layer region in the semiconductor device according to the first embodiment of the present invention.
Figure 10B:
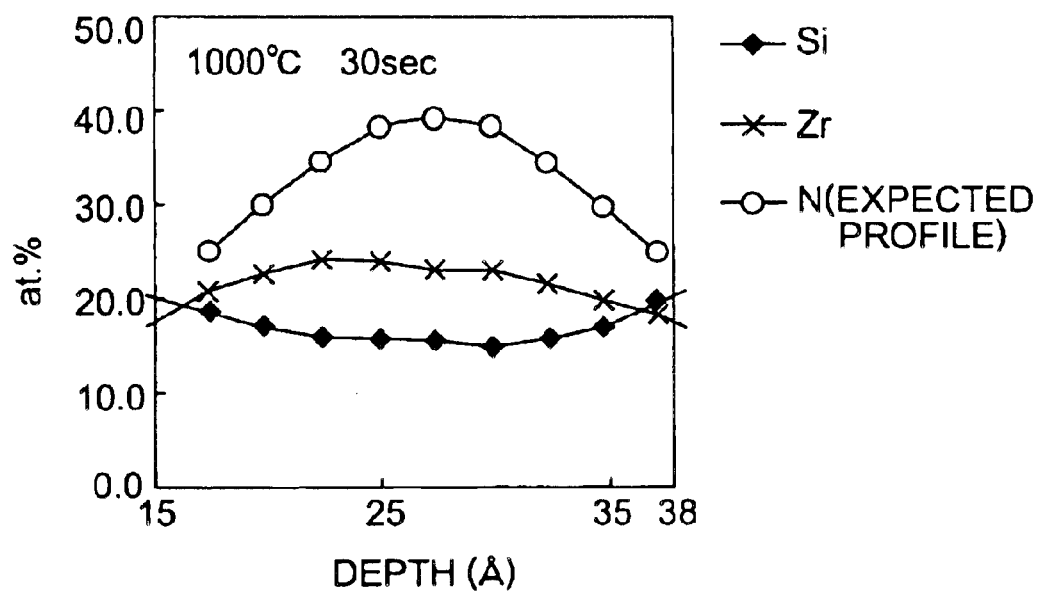
Figure 11A:
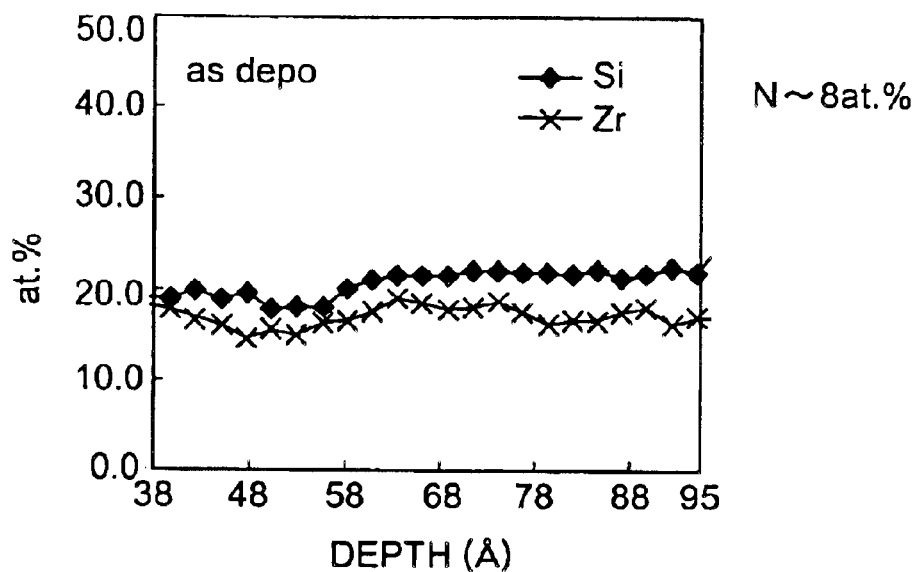
FIGS. 11A and 11B show measurement results of concentration distributions of a metal (zirconium) and silicon before and after heat treatment in a first layer region in the semiconductor device according to the first embodiment of the present invention.

FIG. 9A shows a concentration distribution of the second layer region 52, e.g., a region of 0 to 15 Angstroms in depth, before the heat treatment; FIG. 9B shows a concentration distribution of the second layer region 52 after the heat treatment; FIG. 10A shows a concentration distribution of the third layer region 53, e.g., a region of 15 to 38 Angstroms in depth before the heat treatment; FIG. 10B shows a concentration distribution of the third layer region 53 after the heat treatment; FIG. 11A shows a concentration distribution of the first layer region 51, e.g., a region of 38 to 95 Angstroms in depth before the heat treatment; FIG. 9B shows a concentration distribution of the first layer region 51 after the heat treatment. The concentration distributions were measured by HR RBS (High Resolution Ruthereford Back Scattering).

The nitrogen concentration before the heat treatment was 8 at % in the region from 0 to 15 Angstroms in depth, about 40 at % in the region from 15 to 38 Angstroms in depth, and about 8 at % in the region from 38 to 95 Angstroms in depth. The concentrations of zirconium and silicon were substantially uniform in the depth direction.

In FIG. 9A, the zirconium concentration decreases down to 5 at %. The reason for this is that a contaminant such as carbon gets into the surface side, thereby relatively lowering the atomic concentration of silicon and zirconium. However, when the degree of contamination is very low as in the case of an actual process of manufacturing a semiconductor device, such a problem does not arise. Even if a contamination were observed, the contaminant would decrease after annealing. Ideally, the zirconium concentration is perfectly uniform at the stage of FIG. 9A However, in reality, the zirconium concentration may vary. In such a case, when the degree of variation is in the range of about 20% or less, it is possible to obtain the desired effect. Comparing the zirconium concentration of FIG. 9A with the zirconium concentration after the heat treatment, it can be said that the zirconium concentration of FIG. 9A is more uniform.

Figure 11B:
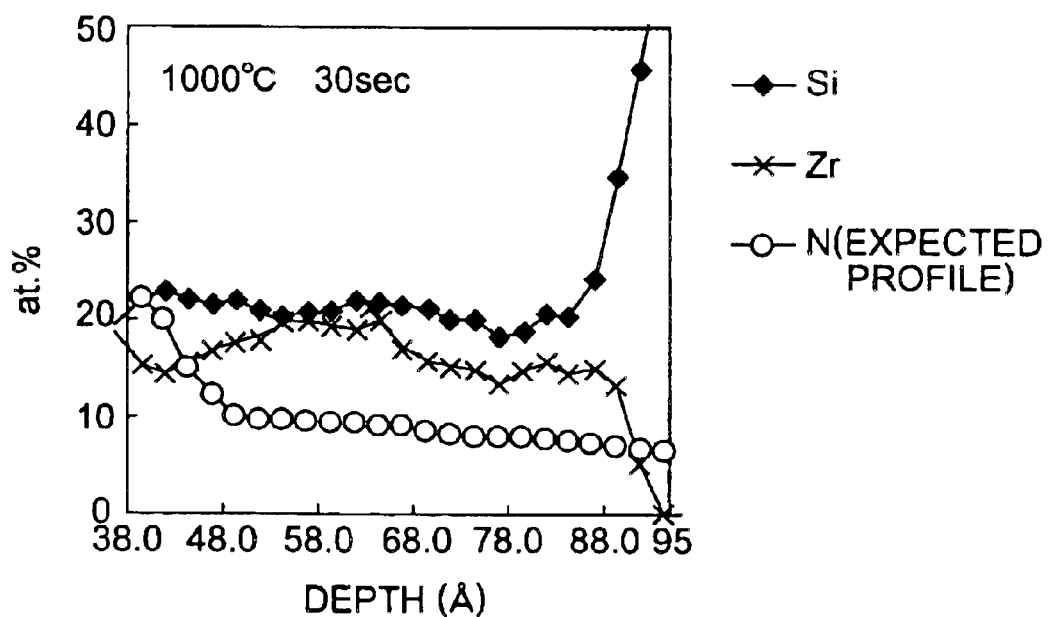

As can be understood from FIGS. 9B, 10B, and 11B, in the regions at the silicon substrate 10 side and the conductive cap layer 14 side where the nitrogen concentration is lower, a zirconium concentration distribution is achieved by the heat treatment, in which the zirconium concentration is lower at the surface and the interfaces, and higher inside the layer.

As can be understood from FIGS. 10A and 10B, in the central region where the nitrogen concentration was higher before the heat treatment, silicon and zirconium atoms hardly moved after the heat treatment. Thus, it is possible to form the metal silicate layer 12a having a graded metal composition through the manufacturing method according to the first embodiment.

Although the embodiments of the present invention and the examples thereof have been described above, the present invention is not limited to such embodiments, but can be appropriately modified within the scope of the appended claims.

For example, the structure of transistor is not limited to the one specifically described, but all transistors obtained by employing and modifying the present invention are regarded to be within the scope of the appended claims.

For example, the transistors obtained by modifying the material, impurities doped, thickness, shape, conductive type, forming method, etc. can be considered to be within the scope of the appended claims.

As described above, according to the embodiments of the present invention, it is possible to provide a semiconductor device using a metal silicate layer for maintaining a good interface characteristic and for decreasing a leakage current of the dielectric film, and a method of easily manufacturing such a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a semiconductor substrate;
   a gate dielectric film containing at least nitrogen and a metal, the gate dielectric film being formed on the semiconductor substrate, and including a first layer region contacting the semiconductor substrate, a second layer region located at a side opposite to that of the first layer region in the gate dielectric film, and a third layer region located between the first and second layer regions, a maximum value of a nitrogen concentration in the third layer region being higher than maximum values thereof in the first and second layer regions;
   a gate electrode contacting the second layer region; and
   a pair of source and drain regions formed at both sides of the gate dielectric film in the semiconductor substrate.

2. The semiconductor device according to claim 1, wherein a maximum value of a metal concentration in the third layer region is higher than maximum values thereof in the first and second layer regions.

3. The semiconductor device according to claim 1, wherein the metal is one selected from the group consisting of zirconium, hafnium, titanium, tantalum, aluminum, and a rare-earth element.

4. The semiconductor device according to claim 1, wherein the gate dielectric film is formed of a metal silicate.

5. The semiconductor device according to claim 4, wherein a maximum value of a metal concentration in the third layer region is higher than maximum values thereof in the first and second layer regions.

6. The semiconductor device according to claim 5, wherein the metal is one selected from the group consisting of zirconium, hafnium, titanium, tantalum, aluminum, and a rare-earth element.

7. The semiconductor device according to claim 1, wherein a metal concentration is uniform in the first, second and third layer regions.

8. The semiconductor device according to claim 7, wherein the metal is one selected from the group consisting of zirconium, hafnium, titanium, tantalum, aluminum, and a rare-earth element.

9. The semiconductor device according to claim 7, wherein the gate dielectric film is formed of a metal oxide.

10. The semiconductor device according to claim 9, wherein an oxygen concentration in the gate dielectric film is relatively higher in the first and second layer regions than in the third layer region.

11. A method of manufacturing a semiconductor device comprising a metal silicate layer formed on a semiconductor substrate, the metal silicate layer containing at least nitrogen and including a first layer region located at a side of the semiconductor substrate, a second layer region located at a side opposite to that of the first layer region, and a third layer region located between the first and second layer regions, the method comprising:
    depositing a metal silicate layer having a uniform metal concentration throughout the first, second, and third layer regions; and
    performing a heat treatment on the metal silicate layer so that a nitrogen concentration in the metal silicate layer becomes higher in the third layer region than in the first and second layer regions.

12. The method of manufacturing a semiconductor device according to claim 11, wherein the nitrogen concentration distribution in the metal silicate layer is controlled by changing a ratio of argon gas, nitrogen gas, and oxygen gas over a period of time during the depositing of the metal silicate layer.

13. The method of manufacturing a semiconductor device according to claim 11, wherein the metal is one selected from the group consisting of zirconium, hafnium, titanium, tantalum, aluminum, and a rare-earth element.

14. The method of manufacturing a semiconductor device according to claim 11, wherein the metal silicate layer is a gate dielectric film of a MOSFET.

15. A method of manufacturing a semiconductor device comprising a metal oxide layer formed on a semiconductor substrate, the metal oxide layer containing at least nitrogen and including a first layer region located at a side of the semiconductor substrate, a second layer region located at a side opposite to that of the first layer region, and a third layer region located between the first and second layer regions, the method comprising:
    depositing a metal oxide layer having a uniform metal concentration throughout the first, second, and third layer regions; and
    performing a heat treatment on the metal oxide layer so that a nitrogen concentration in the metal oxide layer becomes higher in the third layer region than in the first and second layer regions.

16. The method of manufacturing a semiconductor device according to claim 15, wherein the nitrogen concentration distribution in the metal oxide layer is controlled by changing a ratio of nitrogen gas over a period of time during the depositing of the metal oxide layer.

17. The method of manufacturing a semiconductor device according to claim 15, wherein the metal is one selected from the group consisting of zirconium, hafnium, titanium, tantalum, aluminum, and a rare-earth element.

18. The method of manufacturing a semiconductor device according to claim 15, wherein the metal oxide layer is a gate dielectric film of a MOSFET.

* * * * *